United States Patent
Ishizuka et al.

(10) Patent No.: US 6,666,690 B2
(45) Date of Patent: Dec. 23, 2003

(54) COIL SPRING CONTACT CONNECTOR

(75) Inventors: Shinichi Ishizuka, Tokyo-To (JP); Kenji Endo, Tokyo-To (JP)

(73) Assignee: Yokowo Co., Ltd., Tokyo-To (JP)

( * ) Notice: Subject to any disclaimer, the term of this patent is extended or adjusted under 35 U.S.C. 154(b) by 0 days.

(21) Appl. No.: 10/239,526

(22) PCT Filed: Mar. 16, 2001

(86) PCT No.: PCT/JP01/02136

§ 371 (c)(1),
(2), (4) Date: Sep. 23, 2002

(87) PCT Pub. No.: WO01/71853

PCT Pub. Date: Sep. 27, 2001

(65) Prior Publication Data

US 2003/0040201 A1 Feb. 27, 2003

(30) Foreign Application Priority Data

| Mar. 24, 2000 | (JP) | ........................................ 2000-084791 |
| Jul. 14, 2000 | (JP) | ........................................ 2000-231994 |
| Dec. 6, 2000 | (JP) | ........................................ 2000-371576 |

(51) Int. Cl.[7] ................................................. H05K 1/00
(52) U.S. Cl. ............................ 439/66; 439/840; 439/591
(58) Field of Search ........................... 439/66, 840, 841, 439/591

(56) References Cited

U.S. PATENT DOCUMENTS

| 5,007,842 A | * | 4/1991 | Deak et al. ................... 439/66 |
| 5,030,109 A | * | 7/1991 | Dery ............................ 439/66 |
| 5,061,191 A | | 10/1991 | Casciotti et al. |
| 5,273,438 A | * | 12/1993 | Bradley et al. ............... 439/66 |
| 6,439,894 B1 | * | 8/2002 | Li ............................... 439/66 |

FOREIGN PATENT DOCUMENTS

| JP | 9-82390 | 3/1997 |
| JP | 10-12777 | 1/1998 |
| JP | 11-40292 | 2/1999 |

* cited by examiner

*Primary Examiner*—Hung V. Ngo
(74) *Attorney, Agent, or Firm*—Dickstein Shapiro Morin & Oshinsky LLP (57) ABSTRACT

A coil spring contact connector (C) includes a plurality of coil spring contacts (1) and an insulating holder (2) holding the coil spring contacts arranged at intervals. Each coil spring contact has a pair of end contact coils (10) to be brought into contact with a terminal electrode (6c), and middle contact coils (12) radially offset relative to the end contact coils (10) so as to be brought into contact with another terminal electrode (5c). The holder is provided with openings through which contact parts of the end and the middle contact coils project outside, respectively, restrains each coil spring contact (1) from axial deformation and axial movement, and allows each coil spring contact (1) to be deformed in an offset direction thereof.

9 Claims, 10 Drawing Sheets

FIG. 13

COIL SPRING CONTACT CONNECTOR

TECHNICAL FIELD

The present invention relates to a coil spring contact connector, i.e., a connector provided with coil spring contacts, to be disposed between two units or circuit boards to electrically connect the respective terminal electrodes thereof.

BACKGROUND ART

An elastic-contact connector provided with conducting rubber contacts housed in a case has been used as a connector to be disposed between two units or circuit boards to electrically connect the respective terminal electrodes thereof. The elastic-contact connector has a drawback that the conducting rubber contacts bulge out of the case and make stable contact difficult.

Figure 12:
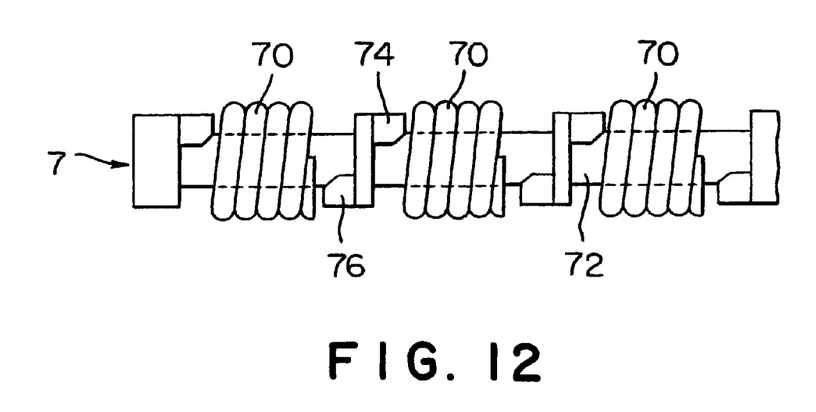
FIG. 12 is a side elevation of a conventional side elevation of a coil spring contact connector.
Figure 13:
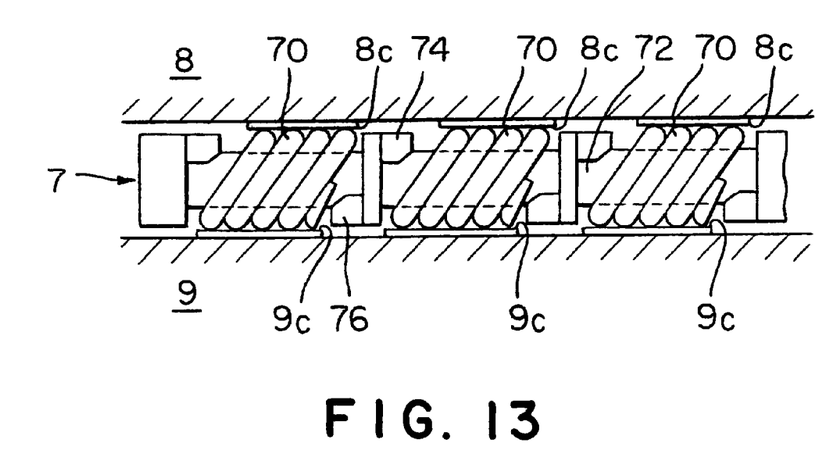
FIG. 13 is a side elevation of the coil spring contact connector shown in FIG. 12 in a working state.

A coil spring contact connector proposed in JP 10-12777 A (1998) is provided with coil spring contacts instead of conducting rubber contacts as shown in FIGS. 12 and 13.

Referring to FIG. 12, a coil spring contact connector 7 includes a plurality of coil spring contacts 70, and an insulating rod 72 extended through the plurality of coil spring contacts 70. A pair of projections 74 and 76 is disposed between the adjacent coil spring contacts 70.

When electrically connecting terminal electrodes 8c and 9c respectively formed on circuit boards 8 and 9, the circuit boards 8 and 9 are pressed against the coil spring contacts 70 so that the coil spring contacts 70 are held between the terminal electrodes 8c and 9c as shown in FIG. 13. Each coil spring contact 70 is deformed elastically such that its coils are tilted with respect to its axis. Consequently, upper and lower circumferential contact parts of each coil spring contact 70 are pressed elastically against the respective contact electrodes 8c and 9c of the boards 8 and 9, respectively, so that the terminal electrodes 8c and 9c are electrically connected.

Another coil spring contact connector disclosed in JP 11-40292 A (1999), similarly to the foregoing conventional coil spring contact connector, includes a coil spring contacts elastically deformable such that coils are tilted with respect to the axis when electrically connecting the terminal electrodes.

Since the coils of the coil spring contacts of the foregoing conventional coil spring contact connectors are elastically tilted with respect to the axis when electrically connecting the terminal electrodes, the axial positions of contact parts of the terminal electrodes with which the coil spring contact comes into contact are dependent on the pressure for pressing the terminal electrodes against the coil spring contact. Thus, there are problems in the accuracy of the positions of the contact parts of the terminal electrodes 8c and 9c with which the coil spring contact 70 comes into contact, and the stability of state of contact between the contact parts of the terminal electrodes 8c and 9c, and the coil spring contact 70.

DISCLOSURE OF THE INVENTION

The present invention has been made in view of the foregoing circumstances. It is therefore an object of the present invention to provide a coil spring contact connector including a coil spring contact, and capable of improving the accuracy of the positions of contact parts of terminal electrodes with which the coil spring contact comes into contact and of improving the state of contact between the coil spring contact and the contact parts of the terminal electrodes.

According to the present invention, a coil spring contact connector includes: a coil spring contact to be brought into elastic contact with first and second terminal electrodes disposed at diametric ends thereof, respectively; and an insulating holder holding the coil spring contact; wherein the coil spring contact has a first contact coil to be brought into contact with the first terminal electrode, and a second contact coil radially offset relative to the first contact coil so as to be brought into contact with the second terminal electrode, and the holder is provided with openings through each of which contact parts of the first and the second contact coils project outside, respectively, and is configured to restrain the coil spring contact from axial deformation and axial movement, and allow the coil spring contact to be deformed in an offset direction.

When the pair of terminal electrodes is pressed in diametrical directions, respectively, against the coil spring contact, the coil spring contact is elastically deformed in the offset direction without being deformed and moved axially. Therefore, the axial position of the coil spring contact with respect to the terminal electrodes is kept unchanged regardless of the magnitude of the pressure pressing the terminal electrodes against the coil spring contact. Thus the accuracy of the positions of contact parts of the terminal electrodes with which the coil spring contact comes into contact and the state of contact between the coil spring contact and the contact parts of the terminal electrodes can be improved.

Since the coil spring contact has the first contact coil and the second contact coil radially offset relative to each other, the coil spring contact of the present invention, as compared with a coil spring contact having coaxially aligned coils, is capable of being sufficiently radially deformed and the diameter of the coils thereof may be small.

Preferably, the coil spring contact further has an intermediate coil connecting the first contact coils and the second contact coils. The intermediate coils further effectively increase the radial deformation of the coil spring contact.

Preferably, the holder has at least a pair of walls disposed on the axially opposite sides, respectively, of the coil spring contact, a distance between the walls being substantially equal to the axial length of the coil spring contact. Thus, the walls of the holder restrain the coil spring contact from axial deformation and axial movement. If the coil spring contact connector is provided with a plurality of coil spring contacts disposed axially side by side, the coil spring contacts can be insulated from each other with reliability by the wall.

Preferably, the holder is provided with a projection axially projecting into the coil spring contact. The projections prevent the coil spring contact from falling out through the openings of the holder.

Preferably, the holder is monolithic. When the holder is monolithic, it is possible to avoid problems arising from dimensional errors that are inevitable when the holder is an assembly of a plurality of members. Thus, the monolithic holder further improves the accuracy of the positions of the parts of the terminal electrodes with which the coil spring contact comes into contact.

BRIEF DESCRIPTION OF THE DRAWINGS

FIG. 2b is a longitudinal sectional view of the coil spring contact connector shown in FIG. 2a;

FIG. 3b is a front elevation of the coil spring contact shown in FIG. 3a;

FIG. 5b is a front elevation of the coil spring contact shown in FIG. 5a;

FIG. 8b is a front elevation of the coil spring contact shown in FIG. 8a;

FIG. 9b is a bottom view of the coil spring contact connector shown in FIG. 9a;

FIG. 10 is across-sectional view taken on line X—X in FIG. 9a;

FIG. 11b is a front elevation of the coil spring contact shown in FIG. 11a;

FIG. 11c is a plan view of the coil spring contact shown in FIG. 11a;

BEST MODE FOR CARRYING OUT THE INVENTION

Preferred embodiments of the present invention will be described with reference to the accompanying drawings. FIGS. 1 to 11c show coil spring contact connectors in preferred embodiments according to the present invention.

First Embodiment

A coil spring contact connector C in a first embodiment according to the present invention will be described with reference to FIGS. 1 to 3b.

[Construction]

Figure 1:
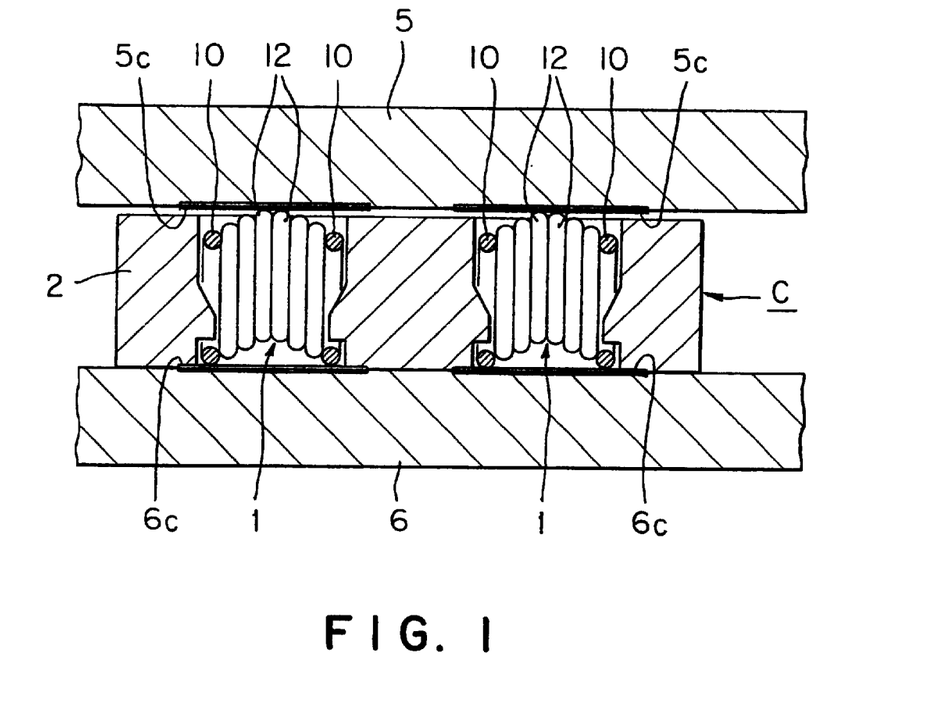
FIG. 1 is a longitudinal sectional view of a coil spring contact connector in a first embodiment according to the present invention in use.

FIG. 1 shows the coil spring contact connector C in the first embodiment in use as applied to, for example, connecting a liquid crystal display panel 5 and a circuit board 6 in a personal digital assistant, such as a portable telephone set. As shown in FIG. 1, terminal electrodes 5c included in the liquid display panel 5 and corresponding terminal electrodes 6c included in the circuit board 6 are connected electrically by the coil spring contact connector C.

Figure 2A:
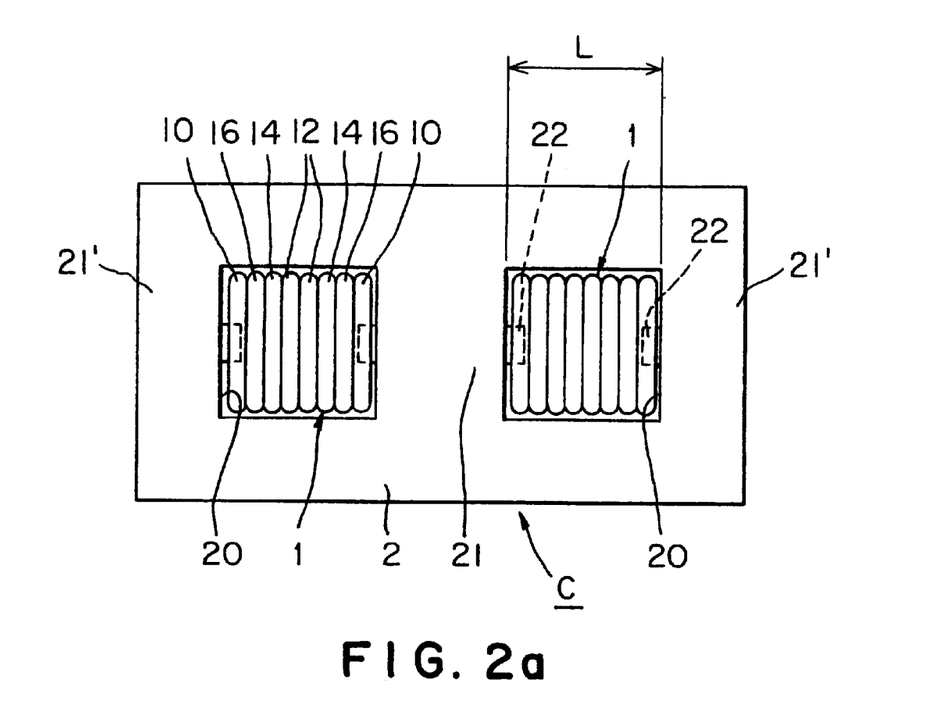
FIG. 2a is a plan view of the coil spring contact connector shown in FIG. 1 in a free state.
Figure 2B:
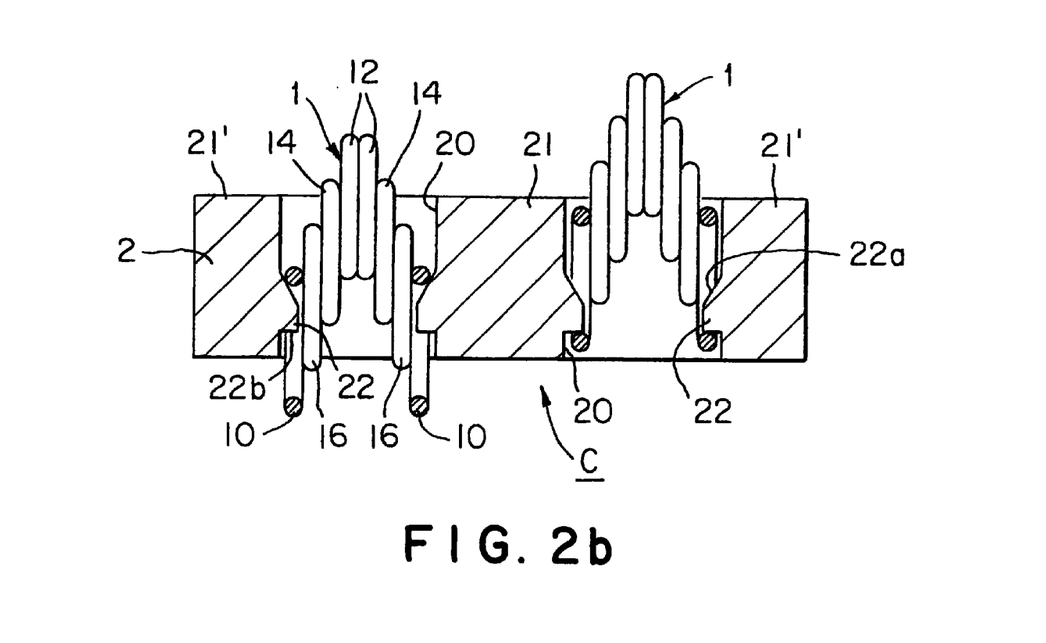

Referring to FIGS. 2a and 2b showing the coil spring contact connector C, the coil spring contact connector C includes two coil spring contacts 1 of a metal, and an insulating holder 2 holding the coil spring contacts 1 in an axial arrangement. The coil spring contacts 1 are axially spaced from each other.

Each of the coil spring contacts 1 can be brought into elastic contact with the terminal electrodes 5c and 6c when the terminal electrodes 5c and 6c are pressed in diametrical directions, respectively, against the coil spring contact 1 as shown in FIG. 1. As shown in FIGS. 1 to 3b, the coil spring contact 1 has a pair of end contact coils (first contact coils) 10 to be brought into contact with the terminal electrode (first terminal electrode) 6c, and a pair of middle contact coils (second contact coils) 12 radially offset relative to the end contact coils 10 so as to be brought into contact with the terminal electrode (second terminal electrode) 5c.

Figure 3A:
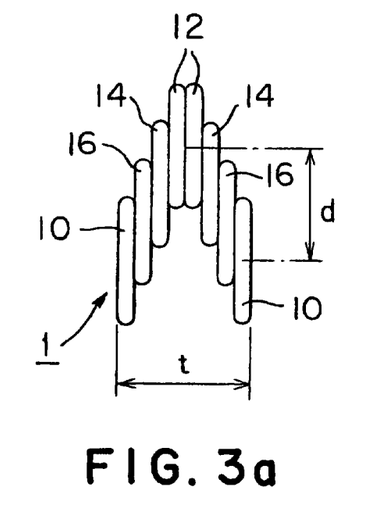
FIG. 3a is a side elevation of a coil spring contact included in the coil spring contact connector shown in FIGS. 2a and 2b.
Figure 3B:
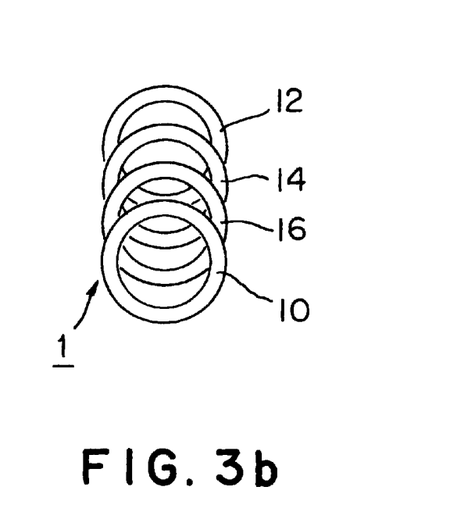

As best shown in FIG. 3b, the coil spring contact 1 has intermediate coils 14 and 16 connecting each end contact coil 10 and the corresponding middle contact oil 12. The intermediate coil 14, the intermediate coil 16 and the end contact coil 10 are arranged in that order on the outer side of each middle contact coil 12. The intermediate coil 14, the intermediate coil 16 and the end contact coil 10 are offset successively in a radial direction at substantially equal intervals. Thus, the coil spring contact 1 has a shape substantially resembling the inverted letter V in side elevation as shown in FIG. 3a.

The respective axes of the coils 10, 12, 14 and 16 are substantially parallel. The direction of the 'axis' of the coil spring contact 1 is parallel to the axes of the coils 10, 12, 14 and 16, and a 'diametrical direction' and a 'radial direction' thereof are perpendicular to the respective axes of the coils 10, 12, 14 and 16, and an 'offset direction' is perpendicular to the axes of the end contact coils 10 and the middle contact coils 12.

The dimensions of the coil spring contact 1 are dependent on the arrangement of the terminal electrodes 5c and 6c. For example, the dimensions of the coil spring contact 1 may be 0.1 mm in the diameter of the wire forming the coil spring contact 1, 0.9 mm in length t, 0.8 mm in the outside diameter of the coils, and 0.75 mm in the maximum distance (maximum offset) d between the respective axes of the end contact coils 10 and the middle contact coils 12.

In view of perfectly preventing the coil spring contact 1 from axial deformation and reducing the electrical resistance of the coil spring contact 1, it is preferable to form the coil spring contact 1 such that the adjacent coils 10, 12, 14 and 16 are in close contact with each other, constituting a closed helical spring.

Referring to FIGS. 2a and 2b, the holder 2 is provided with rectangular, upper and lower openings 20. Contact parts (peripheral parts) of the middle contact coils 12 and the end contact coils 10 project outside through the upper and the lower opening 20, respectively. The holder 2 restrains each coil spring contact 1 from axial movement, i.e. lateral movement as viewed in FIGS. 2a and 2b, and axial deformation, and allows each coil spring contact 1 to be radially deformed, i.e. vertically deformed as viewed in FIG. 2b.

More specifically, the holder 2 has walls 21', 21 and 21' axially arranged in that order so as to hold the coil spring contacts 1 between the walls 21' and 21 and between the walls 21 and 21', respectively. The distance L (FIG. 2a) between the walls 21' and 21 is substantially equal to the length t of each coil spring contact 1, so that the coil spring contact 1 is restrained from axial deformation and axial movement. The middle wall 21 insulates the axially adjacent coil spring contacts 1 from each other with reliability.

The holder 2 is provided with rectangular through holes each extending between the upper and the lower opening 20. Since the opposite ends of the through holes are the openings 20, the through holes will be denoted by the reference numeral 20 in the following description. The through hole 20 has a length L and a width slightly greater than the axial length t (FIG. 3a)) and the width, i.e., the outside diameter of the coils, of the coil spring contact 1, respectively. The coil spring contact 1 is inserted in the offset direction in the through hole 20, so that the coil spring contact 1 can be deformed in the offset direction.

When the liquid crystal display panel 5 and the circuit board 6 are pressed, as shown in FIG. 1, against the upper and the lower surface of the coil spring contact connector C in the free state as shown in FIG. 2b, the coil spring contact 1 is elastically deformed in the offset direction such that the distance d (FIG. 3a)) between the respective axes of the middle contact coils 12 and the end contact coils 10 is reduced.

The walls 21', 21 and 21' of the holder 2 are provided on their inner surfaces with projections 22 axially projecting into the end contact coils of the coil spring contacts 1 placed in the through holes 20. As shown in FIG. 2b, each projection 22 has an upper beveled surface 22a and a lower horizontal surface 22b. A size of each projection 22 along the radius of the end contact coil 10 is comparatively small to enable the coil spring contact 1 to move in the offset direction in a fixed range as shown in FIG. 2b.

[Function and Effect]

The function and effect of the coil spring contact connector in the first embodiment will be described.

When the terminal electrodes 5c and 6c are pressed in diametrical directions against the coil spring contact 1 held in the holder 2, the coil spring contacts 1 are deformed elastically without being deformed and moved in the axial direction.

Thus, the axial positions of contact parts of the terminal electrodes 5c and 6c to be in contact with each coil spring contact 1, respectively, are fixed regardless of the magnitude of pressure pressing the terminal electrodes 5c and 6c against the coil spring contact 1. Consequently, as compared with the conventional coil spring contact which is deformed such that the coils are elastically tilted with respect to the axis thereof, the coil spring contact 1 improves the accuracy of the positions of the contact parts of terminal electrodes 5c and 6c with which the coil spring contact 1 comes into contact and improves the stability of the state of contact between the coil spring contact 1 and the contact parts of the terminal electrodes 5c and 6c.

Since the holder 2 does not need to have any space to allow the coils of the coil spring contact 1 to be elastically tilted with respect to the axis, the axial pitch between the coil spring contacts 1 can be reduced.

The insulating holder 2 can be formed of a synthetic resin or the like in a monolithic structure. Therefore, it is possible to avoid problems arising from dimensional errors that are inevitable when the holder is an assembly of a plurality of members. Thus, the monolithic holder 2 further improves the accuracy of the positions of the contact parts of the terminal electrodes 5c and 6c with which the coil spring contact 1 comes into contact.

Since the coil spring contact 1 has the end contact coils 10, the intermediate coils 14 and 16 and the middle contact coils 12 which are radially offset relative to each other, the coil spring contact 1, as compared with a corresponding coil spring contact having coaxially aligned coils, can be sufficiently radially deformed, and the coils 10, 12, 14 and 16 may be formed in a small diameter. Thus, the coil spring contact connector 1 has a small thickness in a contacting state to enable the terminal electrodes 5c and 6c to be disposed close to each other.

The projections 22 of the holder 2 prevent the coil spring contacts 1 from falling out from the through holes 20 of the holder 2. The beveled surfaces 22a of the projections 22 facilitate the easy insertion of the coil spring contacts 1 into the through holes 20 of the holder 2 from the side of the beveled surfaces 22a.

[Modifications]

The coil spring contact 1 employed in the first embodiment has the two middle contact coils 12. The coil spring contact may have a single middle contact coil 12, such as a coil spring contact 1' shown in FIGS. 4, 5a and 5b. Although the stability of the contact of the single middle contact coil 12 with the terminal electrode is somewhat inferior to that of the two middle contact coils 12, the coil spring contact 1' has a short length t' (FIG. 5a). Thus, the coil spring contacts 1' can be axially arranged at reduced pitches.

Figure 4:
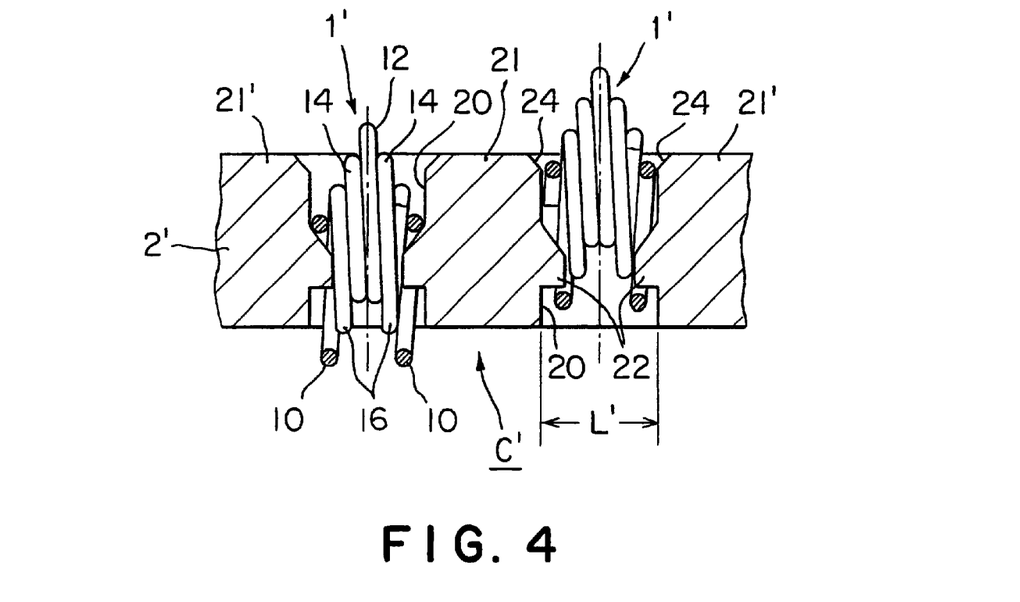
FIG. 4 is a longitudinal sectional view of a coil spring contact connector in a modification of the coil spring contact connector shown in FIG. 1.
Figure 5A:
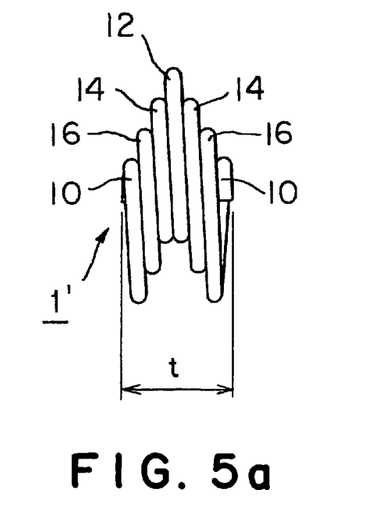
FIG. 5a is a side elevation of a coil spring contact included in the coil spring contact connector shown in FIG. 4.
Figure 5B:
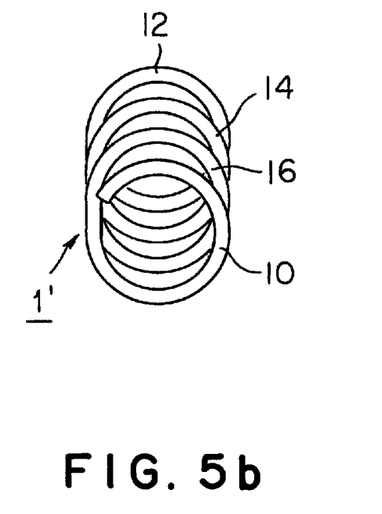
Figure 6:
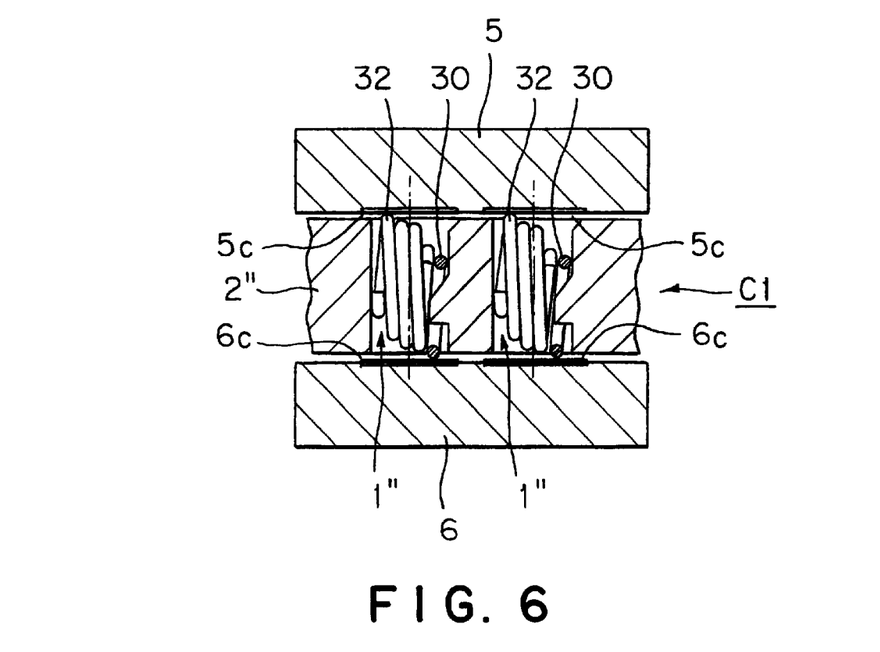
FIG. 6 is a coil spring contact connector in a second embodiment according to the present invention in use.

The holder may have an upper opening 20, through which the coil spring contact is inserted in the holder, having a tapered upper edge, such as a tapered upper part 24 of a holder 2' included in a coil spring contact connector C' shown in FIG. 4. The tapered part 24 guides the end contact coils 10 of the coil spring contact 1' to facilitate the easy insertion of the coil spring contact 1' in the hole 20.

Although both the end contact coils 10 of the coil spring contact connectors C and C' are supposed to come into contact with the terminal electrode 6c, only one of the end contact coils 10 may come into contact with the terminal electrode 6c.

Second Embodiment

A coil spring contact connector C1 in a second embodiment according to the present invention will be described with reference to FIGS. 6 to 8b.

[Construction]

As shown in FIGS. 6 to 8b, the coil spring contact connector C1 in the second embodiment differs principally in the construction of a coil spring contact 1" from and is substantially the same in other respects as the connector C in the first embodiment shown in FIGS. 1 to 3b.

Referring to FIGS. 6 to 8b, the coil spring contact 1" has a first end contact coil (first contact coil) 30 to be brought into contact with a terminal electrode 6c at one axial end thereof, and a second end contact coil (second contact coil) 32 to be brought into contact with a terminal electrode 5c at the other axial end thereof. The first end contact coil 30 and the second end contact coil 32 are offset radially relative to each other.

Figure 8A:
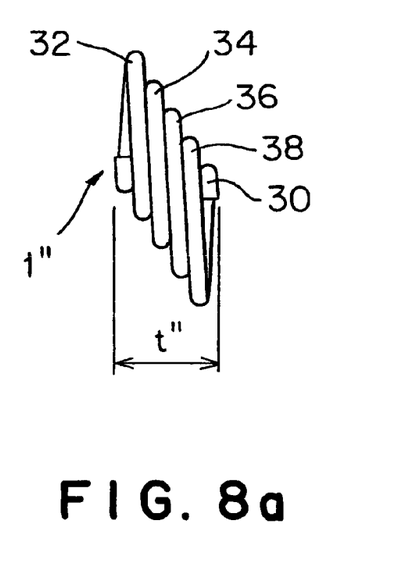
FIG. 8a is a side elevation of a coil spring contact included in the coil spring contact connector shown in FIGS. 7a and 7b.
Figure 8B:
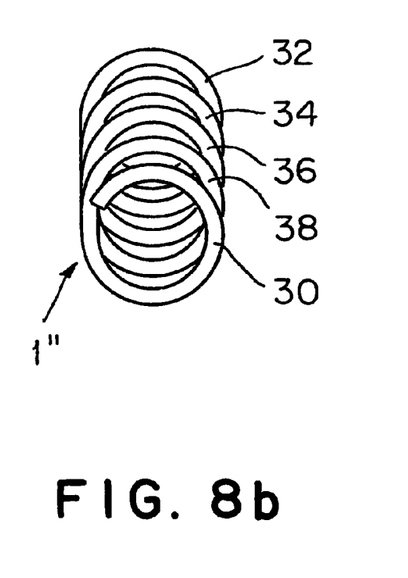

As best shown in FIGS. 8a and 8b, the coil spring contact 1" has intermediate coils 34, 36 and 38 connecting the first end contact coil 30 and the second end contact coil 32. The coils 32, 34, 36, 38 and 30 are arranged in that order and are offset successively from the second end contact coil 32 toward the first end contact coil 30 at substantially equal radial distances, respectively.

The respective axes of the coils 30, 32, 34, 36 and 38, similarly to those of the coils of the coil spring contact 1 of the first embodiment, are substantially parallel. The direction of the 'axis' of the coil spring contact 1" is parallel to the axes of the coils 30, 32, 34, 36 and 38, and a 'diametrical direction' and a 'radial direction' thereof are perpendicular to the respective axes of the coils 30, 32, 34, 36 and 38, and an 'offset direction' is perpendicular to the axes of the end contact coils 30 and 32.

Figure 7A:
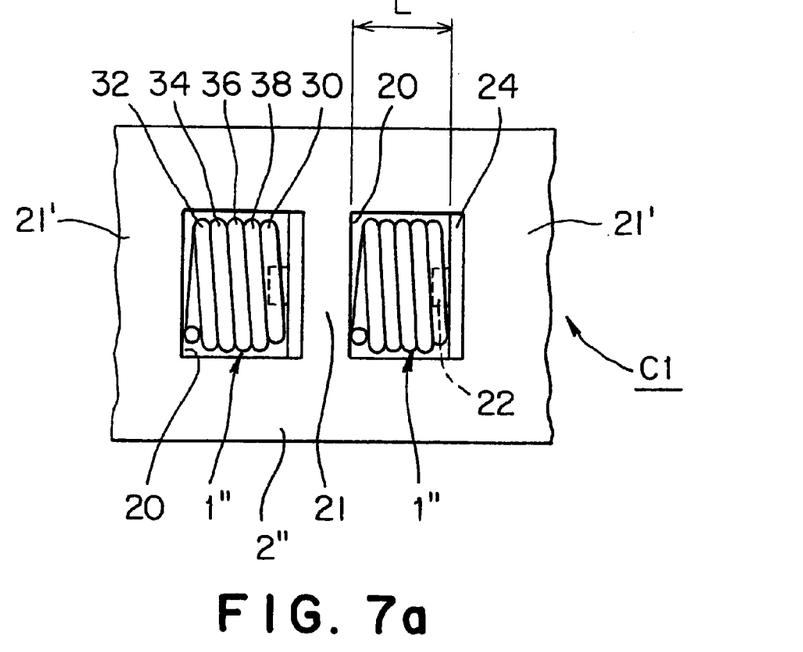
FIG. 7a is a plan view of the coil spring contact connector shown in FIG. 6 in a free state.
Figure 7B:
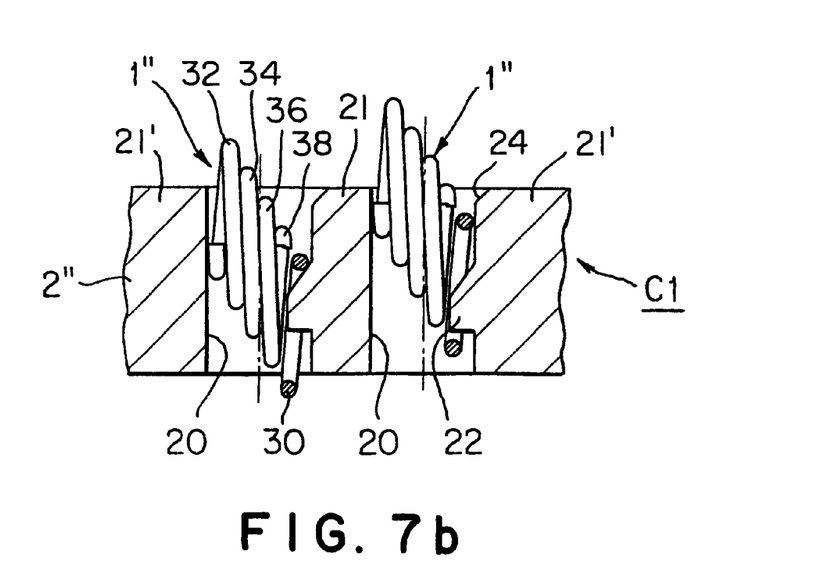
FIG. 7b is a longitudinal sectional view of the coil spring contact connector shown in FIG. 6.

As shown in FIGS. 7a and 7b, in a holder 2" of the second embodiment, each through hole 20 is provided with the projection 22 and the tapered surface 24 only on a side corresponding to the first end contact coil 30 of the coil spring contact 1". The holder 2" is substantially the same in other respects as the holders 2 and 2' of the first embodiment shown in FIGS. 1, 2a, 2b and 4.

[Function and Effect]

The function and effect of the coil spring contact connector C1 in the second embodiment will be described.

Although the stability of state of contact of the coil spring contact 1" with the terminal electrodes 5c and 6c is somewhat inferior to that of the coil spring contact 1 of the first embodiment, basically, the second embodiment is capable of exercising the same function and effect as the first embodiment. The axial length t" of the coil spring contact 1" (FIG. 8a) of each coil spring contact 1", as compared with that of the first embodiment, is short and hence the axial interval between the coil spring contacts 1" can be further reduced.

[Modification]

Although the coil spring contact 1" of the second embodiment has the first end contact coil 30 and the second end contact coil 32 at the opposite ends (axially outermost sides) thereof, respectively, the end contact coils 30 and 32 may be formed on the inner side of the opposite ends; that is, for example, coils corresponding to the intermediate coils 34 and 38 may be formed on the outer side of the end contact coils 30 and 32.

Third Embodiment

A coil spring contact connector C2 in a third embodiment according to the present invention will be described with reference to FIGS. 9a to 11c.

[Construction]

As shown in FIGS. 9a to 11c, the coil spring contact connector C2 in the third embodiment differs from the collector C in the first embodiment principally in that the coil spring contact connector C2 includes a coil spring contact 1A provided with a pair of retaining arms 18, and an insulating holder 2A provided with grooves 26 respectively for receiving the retaining arms 18. The coil spring contact C2 is substantially the same in other respects as the coil spring contact C in the first embodiment shown in FIGS. 1 to 3b.

More specifically, the coil spring contact 1A of the third embodiment, similarly to the coil spring contact 1 of the first embodiment, has a pair of end contact coils (first contact coils) 10 and a pair of middle contact coils (second contact coils) 12. The retaining arms 18 extend respectively from the ends, at the bottom of the coil spring contact 1A, of the end contact coils 10. The retaining arms 18 extend slightly upward in the winding direction of the coils of the coil spring contact 1A in opposite directions, respectively.

Figure 11A:
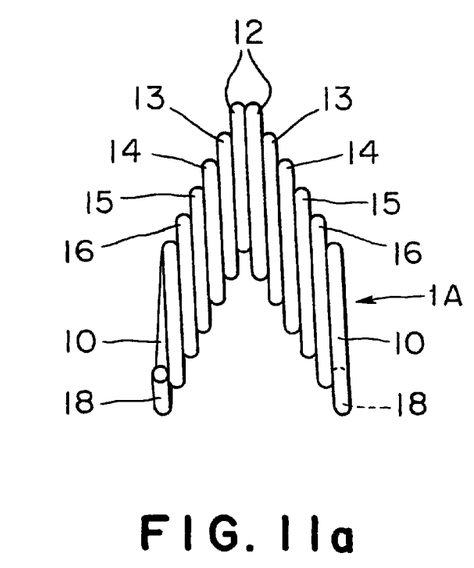
FIG. 11a is a side elevation of coil spring contact included in the coil spring contact connector shown in FIGS. 9a to 10 in a free state.
Figure 11B:
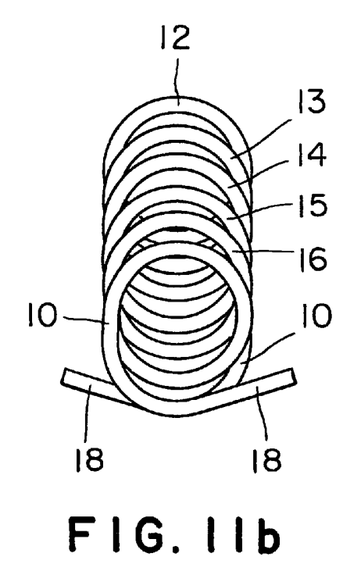
Figure 11C:
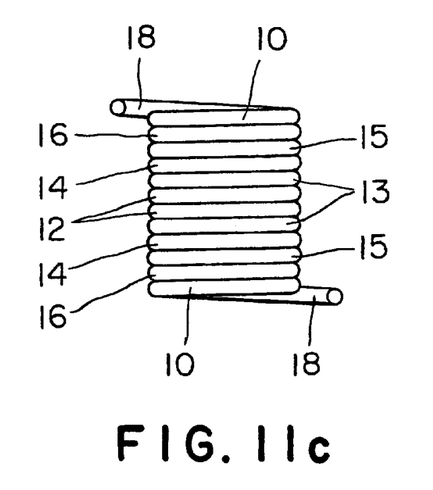

As shown in FIGS. 11a to 11c, the coil spring contact 1A has more intermediate coils 13, 14, 15 and 16 than the coil spring contact 1 of the first embodiment (FIGS. 3a and 3b). Consequently, the maximum axis-to-axis distance between a middle contact coil 12 and an end contact coil 10, i.e., the maximum offset distance d in FIG. 3a can be reasonably increased.

Figure 9A:
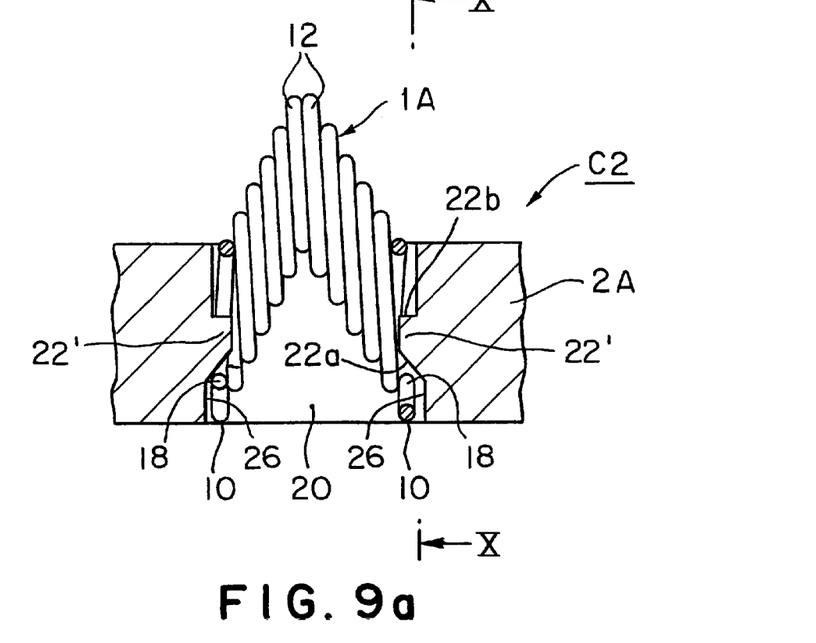
FIG. 9a is a longitudinal sectional view of a coil spring contact connector in a third embodiment according to the present invention.
Figure 9B:
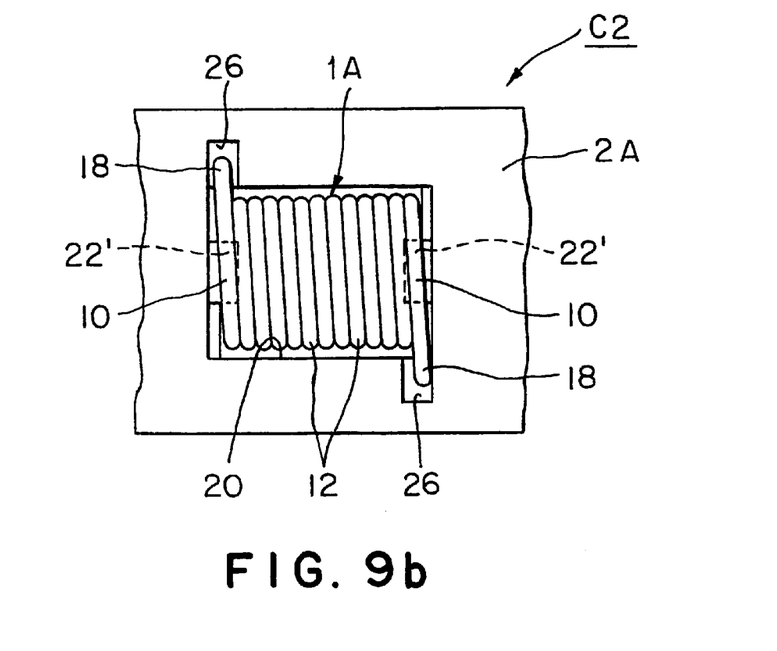
Figure 10:
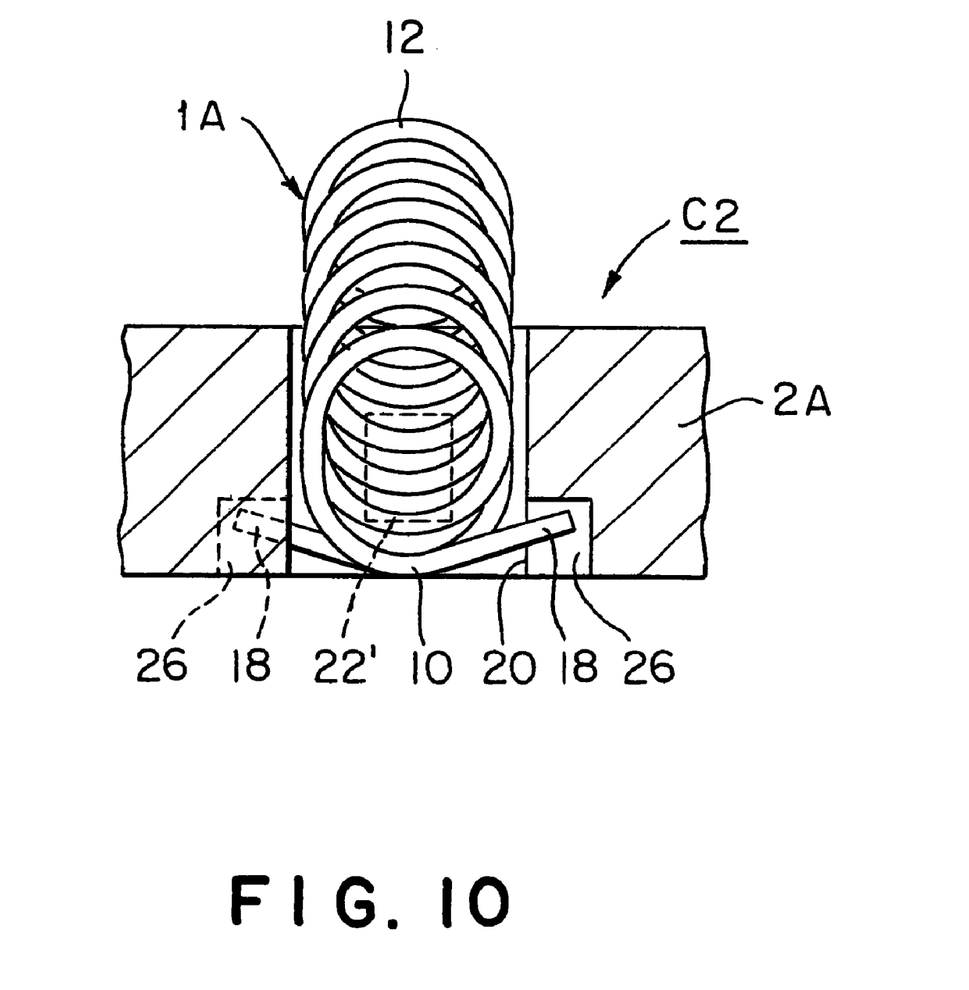

The insulating holder 2A differs from the holder 2 of the first embodiment in that the insulting holder 2A is provided, in addition to the grooves 26, with projections 22' different from the projections 22 of the holder of the first embodiment. Whereas each of the projections 22 of the holder 2 of the first embodiment has the upper beveled surface 22a and the lower horizontal surface 22b as shown in FIG. 2b, each of the projections 22' of the holder 2A has an upper horizontal surface 22b and a lower beveled surface 22a as shown in FIG. 9a.

[Function and Effect]

The function and effect of the coil spring contact connector C2 in the third embodiment will be described.

In the first embodiment, if the number of the intermediate coils of the coil spring contact 1 of the connector C is increased or the maximum axis-to-axis distance (maximum offset distance) d (FIG. 3a) between the middle contact coil 12 and the end contact coil 10 of the coil spring contact 1 is increased, it is possible that the end contact coils 10 are bent inward and are disengaged from the projections 22 of the holder 2, which often causes the coil spring contact 1 to come off the holder 2.

In the coil spring contact connector C2 in the third embodiment, the coil spring contact 1A is inserted in the through hole 20 of the holder 2A through the lower opening on the side of the lower beveled surfaces 22a of the projections 22', while the coil spring contact 1 of the first embodiment is inserted in the through hole 20 through the upper opening. The projections 22' of the holder 2A restrain the coil spring contact 1A from falling off the holder 2A through the lower opening of the through hole 20, and the retaining arms 18 engaged in the grooves 26 of the holder 2A restrain the coil spring contact 1A from coming off the holder 2A through the upper opening of the through hole 20.

The retaining arms 18 engaged in the grooves 26 restrain the end contact coils 10 from axial movement, which enhances the effect of the projections 22' in preventing the coil spring contact 1A from coming off the holder 2A through the lower opening of the through hole 20 (from this point of view, it is preferable that the width of the grooves 26 is only slightly greater than the diameter of the retaining arms 18).

Thus, even though the coil spring contact 1A of the coil spring contact connector in the third embodiment has the increased number of intermediate coils 13, 14, 15 and 16 to increase the maximum axis-to-axis distance (maximum offset distance) between the middle contact coil 12 and the end contact coil 10, the coil spring contact 1A is prevented effectively from falling off the holder 2A.

[Modification]

Although it is advantageous to form the retaining arms 18 of the coil spring contact 1A in the aforesaid shape and to be extend the same in the aforesaid direction from the viewpoint of facilitating the manufacture of the coil spring contact 1A, the retaining arms 18 may be formed in any shape other than the aforesaid shape and extended in any directions other than the aforesaid directions, provided that the retaining arms 18 are capable of performing the aforesaid functions.

Other Embodiments

Although the coil spring contacts 1, 1', 1" and 1A of the foregoing embodiments are arranged in a single row in the axial direction, coils spring contacts similar to the coil spring contacts 1, 1', 1" and 1A may be arranged in a plurality of rows according to the arrangement of the associated terminal electrodes. Although each of the foregoing embodiments is provided with the two coil spring contacts arranged in a single row, three or more coil spring contacts may be arranged in a single row. A coil spring contact connector according to the present invention may be provided with a single coil spring contact similar to any one of the coil spring contacts 1, 1', 1" and 1A.

Although the coil spring contact connector C of the present invention shown in FIG. 1 has been described as applied to electrically connect the liquid crystal display panel 5 and the circuit board 6, the coil spring contact connectors C, C', C1 and C2 of the present invention are applicable for the electrical connection of devices other than the liquid crystal display panel 5, such as a microphone unit, and a wiring board or the like.

The numbers of the coils 10, 12, 14 and 16, the coils 30, 32, 34, 36 and 38, the coils 10 and 12 to 16 of the coil spring contacts 1, 1', 1" and 1A are not limited to those mentioned above and may be subject to change according to conditions.

As obvious from the comparison of the holders 2, 2' and 2" respectively shown in FIGS. 2a, 4 and 7a, when the respective axial lengths t, t' and t" of the coil spring contacts 1, 1' and 1" are reduced, the intervals L, L' and L" between the walls 21', 21 and 21' of the holders 2, 2' and 2" are reduced accordingly, and hence the relative strength and rigidity of the holders 2, 2' and 2" increase accordingly. Therefore, the axial pitches of the coil spring contacts 1, 1' and 1" can be further reduced by reducing the thickness of the walls 21', 21 and 21'.

What is claimed is:

1. A coil spring contact connector comprising:

a coil spring contact to be brought into elastic contact with first and second terminal electrodes disposed at diametric ends thereof, respectively; and an insulating holder holding the coil spring contact;

wherein the coil spring contact has a first contact coil to be brought into contact with the first terminal electrode, and a second contact coil radially offset relative to the first contact coil so as to be brought into contact with the second terminal electrode, and the insulating holder is provided with openings through which contact parts of the first and the second contact coils project outside, respectively, and is configured to restrain the coil spring contact from axial deformation and axial movement, and allow the coil spring contact to be deformed in an offset radial direction of the coil spring contact.

2. The coil spring contact connector according to claim 1, wherein the coil spring contact has a plurality of first contact coils at axially opposite ends thereof, and the second contact coils between the first contact coils.

3. The coil spring contact connector according to claim 1, wherein the coil spring contact has the first contact coils and the second contact coils at axially opposite ends thereof, respectively.

4. The coil spring contact connector according to any one of claims 1 to 3, wherein the coil spring contact has an intermediate coil connecting the first and the second contact coils.

5. The coil spring contact connector according to any one of claims 1 to 3, wherein the holder has at least a pair of walls disposed on the axially opposite sides, respectively, of the coil spring contact, a distance between the pair of walls being approximately equal to the axial length of the coil spring contact.

6. The coil spring contact connector according to any one of claims 1 to 3, wherein the holder is provided with a projection axially projecting into the coil spring contact.

7. The coil spring contact connector according to any one of claims 1 to 3, wherein the holder is monolithic.

8. The coil spring contact connector according to claim 1, wherein an axis of the first contact coil and an axis of the second contact coil are substantially mutually parallel.

9. The coil spring contact connector according to claim 1, wherein a direction of an axis of the coil spring contact is parallel to axes of the first contact coil and the second contact coil.

* * * * *

UNITED STATES PATENT AND TRADEMARK OFFICE
CERTIFICATE OF CORRECTION

PATENT NO. : 6,666,690 B2
DATED : December 23, 2003
INVENTOR(S) : Shinichi Ishizuka et al.

It is certified that error appears in the above-identified patent and that said Letters Patent is hereby corrected as shown below:

<u>Title page,</u>
Item [30], Foreign Application Priority Data,
"200-231994" should read -- 2000-213994 --.

Signed and Sealed this

Sixteenth Day of March, 2004

JON W. DUDAS
*Acting Director of the United States Patent and Trademark Office*

UNITED STATES PATENT AND TRADEMARK OFFICE
CERTIFICATE OF CORRECTION

PATENT NO.    : 6,666,690 B2
DATED         : December 23, 2003
INVENTOR(S)   : Shinichi Ishizuka et al.

It is certified that error appears in the above-identified patent and that said Letters Patent is hereby corrected as shown below:

<u>Title page,</u>
Item [30], Foreign Application Priority Data,
"2000-231994" should read -- 2000-213994 --.

This certificate supersedes Certificate of Correction issued March 16, 2004.

Signed and Sealed this

Tenth Day of August, 2004

JON W. DUDAS
*Acting Director of the United States Patent and Trademark Office*